United States Patent
Oi et al.

(10) Patent No.: US 7,214,961 B2
(45) Date of Patent: May 8, 2007

(54) SEMICONDUCTOR TESTING DEVICE AND SEMICONDUCTOR TESTING METHOD

(75) Inventors: Kenichi Oi, Osaka (JP); Hirotaka Jiten, Osaka (JP)

(73) Assignee: Espec Corp., Osaka (JP)

( * ) Notice: Subject to any disclaimer, the term of this patent is extended or adjusted under 35 U.S.C. 154(b) by 338 days.

(21) Appl. No.: 11/000,039

(22) Filed: Dec. 1, 2004

(65) Prior Publication Data
US 2005/0133786 A1    Jun. 23, 2005

(30) Foreign Application Priority Data
Dec. 2, 2003    (JP)    ............... 2003-403544

(51) Int. Cl.
  *H01L 23/58*    (2006.01)
  *H01L 21/66*    (2006.01)
  *G01R 31/26*    (2006.01)
(52) U.S. Cl. .................... 257/48; 257/E21.531; 438/17
(58) Field of Classification Search .................. 257/48; 438/17
See application file for complete search history.

(56) References Cited

U.S. PATENT DOCUMENTS 6,278,128 B1 * 8/2001 Noji et al. .................... 257/48

6,433,360 B1 * 8/2002 Dosdos et al. ................ 257/48

FOREIGN PATENT DOCUMENTS

JP    09-045740 A    2/1997
JP    2002-329759 A    11/2002

* cited by examiner

*Primary Examiner*—David A. Zarneke
(74) *Attorney, Agent, or Firm*—Harness, Dickey & Pierce, P.L.C.

(57) ABSTRACT

A semiconductor testing device of the invention has a measuring substrate that is provided with holes therethrough for exposing a pad of each of the dies of a semiconductor wafer mounted on the measuring substrate, the semiconductor wafer being supported by a wafer holder on one side of the measuring substrate, and the other side of the measuring substrate being provided with a wiring pattern for transmitting an evaluation test signal to the semiconductor wafer supported on the measuring substrate. The measuring substrate, with the pad of each of the dies being wire bonded with a pad of the wiring pattern through the holes, are set for an evaluation test so that a mount part of the semiconductor is placed inside a high temperature chamber, and that a terminal part for applying the evaluation test signal is placed outside of the high temperature chamber. As a result, there is provided a semiconductor testing device, inexpensively, that can suitably evaluate a semiconductor under a temperature of about 400° C., as in EM evaluation for example.

8 Claims, 6 Drawing Sheets

SEMICONDUCTOR TESTING DEVICE AND SEMICONDUCTOR TESTING METHOD

This Nonprovisional application claims priority under 35 U.S.C. § 119(a) on Patent Application No. 403544/2003 filed in Japan on Dec. 2, 2003, the entire contents of which are hereby incorporated by reference.

FIELD OF THE INVENTION

The present invention relates to a semiconductor testing device and a semiconductor testing method for conducting evaluation tests on semiconductors.

BACKGROUND OF THE INVENTION

Conventionally, in testing semiconductors for evaluation, and more particularly in a reliability evaluation test, EM (electromigration) has been an important test element for evaluating reliability such as life of a semiconductor.

An EM evaluation observes how the electrons flowing through thin wires formed in a semiconductor element push the metal ions toward the positive potential, and how the resulting increase in current density at the holes causes wire breakage. Furthermore, in order to save time, an EM evaluation test is carried out by increasing a current flow through the semiconductor element under high temperatures (200° C. to 400° C.) where metal ions are activated, and changes in wiring resistance over time are measured for evaluation.

Thus, since an EM evaluation is conducted under high temperatures, the semiconductor is generally assembled by die bonding to an expensive heat-resistant ceramic package and then making bonding wires for every evaluation element (TEG: test element group).

The complete package is mounted in an even more expensive ceramic socket, is drawn out of the high temperature with a special heat-resistant electric wire, and is wired to a connector connected to a measuring instrument. In this method, a great deal of time and cost are required for packaging, and the prices of evaluation devices including the sockets and the like become high.

Accordingly, there have been proposed semiconductor evaluation methods which do not employ packaging steps or wiring using a socket or a heat-resistant wire, but directly connect a TEG in a wafer state to a wiring circuit on a wiring substrate, as disclosed in, for example, Japanese Laid-Open Publication No. 45740/1997 (Tokukaihei 9-45740; published on Feb. 14, 1997) (Document 1), and Japanese Laid-Open Publication No. 329759/2002 (Tokukai 2002-329759; published on Nov. 15, 2002) (Document 2).

However, in Document 1, an evaluation is only conducted to check the operative condition of a semiconductor chip at ordinary temperature, and it is not for conducting an EM evaluation on a semiconductor element under high temperatures.

On the contrary, Document 2 is for conducting an EM evaluation and the like on a semiconductor element under high temperatures. However, the method suffers from a drawback in that, when a semiconductor wafer and a measuring instrument, connected to each other through a prober, are heated to a high temperature (400° C.), the heat will cause trouble in the prober, and an accurate evaluation cannot be carried out.

The prober may be processed to withstand heat; however, this will increase the cost of an entire evaluation device.

SUMMARY OF THE INVENTION

It is an object of the present invention to realize a semiconductor testing device and a semiconductor testing method that allow EM evaluations and the like to be conducted on semiconductors inexpensively and suitably at a temperature of about 400° C.

In order to achieve the foregoing object, the present invention provides a semiconductor testing device for, with a semiconductor wafer mounted as a test piece on a measuring substrate, conducting an evaluation test on the semiconductor wafer by applying an evaluation test signal to the semiconductor wafer through the measuring substrate. The semiconductor testing device has a high temperature chamber for setting a temperature of the semiconductor wafer mounted on the measuring substrate at a temperature required for an evaluation test and a wafer supporting member for supporting the semiconductor wafer when the semiconductor wafer is mounted on the measuring substrate. The measuring substrate is a substantially oblong steel plate whose surface is coated with an insulating film capable of withstanding high temperatures required for evaluation tests. The measuring substrate is provided with holes therethrough for exposing a pad of each of the dies of the semiconductor wafer mounted on the measuring substrate. The semiconductor wafer is supported by the wafer supporting member on one side of the measuring substrate, and the other side of the measuring substrate is provided with a wiring pattern for transmitting the evaluation test signal to the semiconductor wafer supported on the measuring substrate. The measuring substrate is set for the evaluation test so that, with the pad of each of the dies and the wiring pattern being wire bonded through the holes, a mount part of the semiconductor wafer and a terminal part for applying the evaluation test signal are placed respectively inside and outside of the high temperature chamber.

According to the above-mentioned structure, the measuring substrate is a substantially oblong steel plate whose surface is coated with an insulating film capable of withstanding high temperatures required for evaluation tests. The measuring substrate is provided with holes therethrough for exposing a pad of each of the dies of the semiconductor wafer mounted on the measuring substrate. The semiconductor wafer is supported by the wafer supporting member on one side of the measuring substrate, and the other side of the measuring substrate is provided with a wiring pattern for transmitting the evaluation test signal to the semiconductor wafer supported on the measuring substrate. The measuring substrate is set for the evaluation test so that, with the pad of each of the dies and the wiring pattern being wire bonded through the holes, a mount part of the semiconductor wafer and a terminal part for applying the evaluation test signal are placed respectively inside and outside of the high temperature chamber. In this way, the temperature of the terminal part for applying the evaluation test signal can be made lower than the temperature inside the high temperature chamber.

This reduces the adverse effect of heat on a measuring device and the like connected to the terminal part for applying an evaluation test signal, enabling a suitable evaluation test. For example, even in an evaluation in which a semiconductor wafer needs to be heated to about 400° C. as in the EM evaluation, the terminal part for applying an evaluation test signal will not be exposed to such a high temperature as 400° C., because it is placed outside of the high temperature chamber.

Moreover, since the measuring substrate is a substantially oblong steel plate whose surface is coated with an insulating film capable of withstanding high temperatures required for the evaluation test, it is no longer necessary to use a conventional expensive ceramic substrate. As a result, an inexpensive evaluation device, i.e., semiconductor testing device can be provided.

Other objects, features, and advantages of the present invention will be fully understood through the following description. In addition, merits of the present invention will become apparent in the next description in reference to the accompanying drawings.

DESCRIPTION OF THE EMBODIMENTS

An embodiment of the invention will be described below.

A semiconductor testing device according to this embodiment is a device that, with a semiconductor wafer mounted as a test piece on a measuring substrate, conducts an evaluation test on the semiconductor wafer by applying an evaluation test signal on the semiconductor wafer through the measuring substrate. For example, as shown in FIG. 1, the semiconductor testing device conducts various types of evaluation tests with a semiconductor wafer 5 mounted on a measuring substrate 1.

Figure 1:
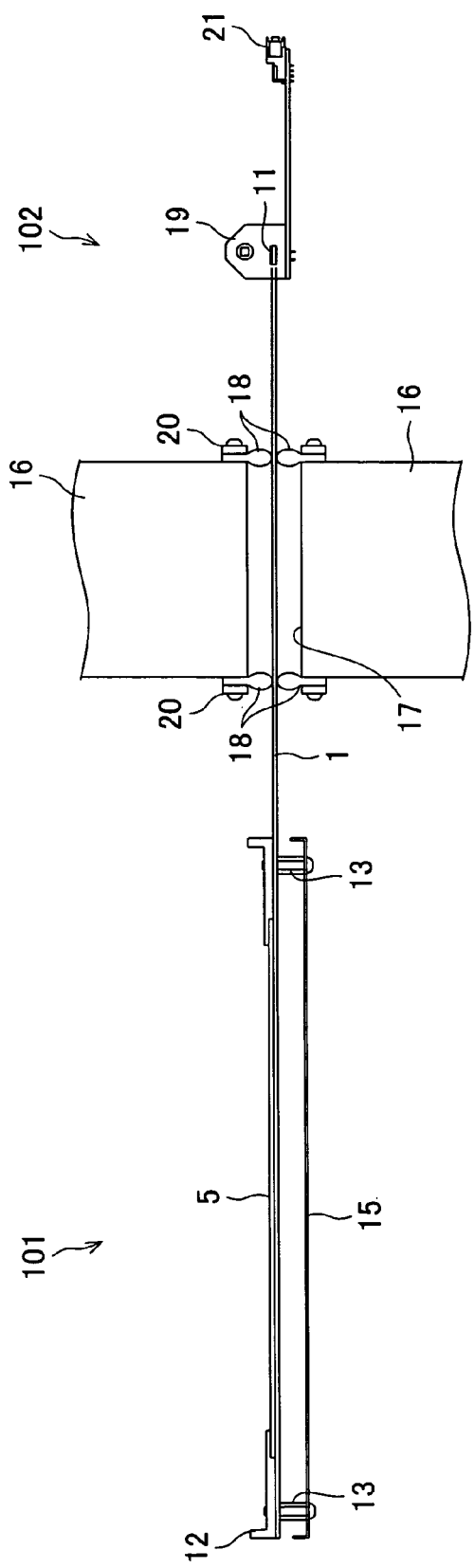
FIG. 1 is a schematic diagram showing a main portion of a semiconductor testing device according to one embodiment of the present invention.

As shown in FIG. 1, the semiconductor testing device includes a high temperature chamber 101 for setting the temperature of the semiconductor wafer 5 as required for an evaluation test of the semiconductor wafer 5, and a signaling chamber 102 for supplying an evaluation test signal to be applied to the semiconductor wafer 5.

The high temperature chamber 101 is able to keep heating the semiconductor wafer 5 according to evaluation tests of semiconductors. The present embodiment assumes an EM evaluation, in which a semiconductor wafer 5 needs to be heated up to about 400° C.

In addition, the signaling chamber 102 is provided with a connector 19, to which a terminal 11 (a terminal that is connected to a wiring pattern 3 to be described later) on the edge of the measuring substrate 1 is connected. The connector 19 is provided with a terminal 21 that is connected to a measuring instrument (not shown).

Therefore, since the signaling chamber 102 is, as mentioned above, provided with means (a measuring instrument and the like) by which an evaluation test signal is sent to the semiconductor wafer 5, it needs to avoid the high temperature of the high temperature chamber 101.

Accordingly, in this embodiment, a heat insulating wall 16 is, as shown in FIG. 1, provided between the high temperature chamber 101 and the signaling chamber 102, so that the heat of the high temperature chamber 101 does not easily transfer to the signaling chamber 102. This makes it possible to keep the inside temperature of the signaling chamber 102 lower than that of the high temperature chamber 101.

The heat insulating wall 16 is provided with a hole 17 for the measuring substrate 1 to pass through. The hole 17 is equipped with flexible materials 18 serving as heat insulating members. The flexible materials 18 are provided at the both ends of the hole 17 meeting the high temperature chamber 101 and the signaling chamber 102, and are tightly in contact with both surfaces of the measuring substrate 1. The flexible materials 18 are formed of a bundle of fiberglass and the like for example, and are fastened on the surface of the heat insulating wall 16 with screws 20.

Thus, providing the flexible materials 18 at the openings of the hole 17 makes it possible to maintain the heat insulation effect when the measuring substrate 1 is set in the semiconductor testing device.

Thus, by the provision of the heat insulating wall 16 between the high temperature chamber 101 and the signaling chamber 102, the high temperature of the high temperature chamber 101 can be maintained for accurate testing. In addition, the signaling chamber 102, i.e., exterior of the hole 17, is provided with a connector 19, which is to be connected to a measuring instrument. (not shown). The connector 19 and the terminal 11 interdigitate to electrically connect an evaluation element of the semiconductor wafer 5 to the measuring instrument, so that testing may be conducted. The signaling chamber 102 needs to be kept away from high temperature. Enhancing airtightness as above by providing the flexible materials 18 at the respective openings of the hole 17 lowers heat transfer from the high temperature chamber 101 to the signaling chamber 102.

Moreover, in this embodiment, in order to enhance the cooling effect in the signaling chamber 102, a ventilator (not shown) is provided for ventilating a portion of the measuring substrate 1 exposed outside of the high temperature chamber 101, i.e., a portion exposed inside the signaling chamber 102.

Note that, since it is the high temperature chamber 101 that needs to be heated, the signaling chamber 102 does not need to be treated as a chamber. In fact, a corresponding part of the signaling chamber 102 may be left open.

That is, the signaling chamber 102 does not need to be a chamber since the measuring substrate 1 only needs to set a mount part of the semiconductor wafer 5 inside the high temperature chamber 101, and a terminal part for applying an evaluation test signal outside of the high temperature chamber 101.

Figure 5:
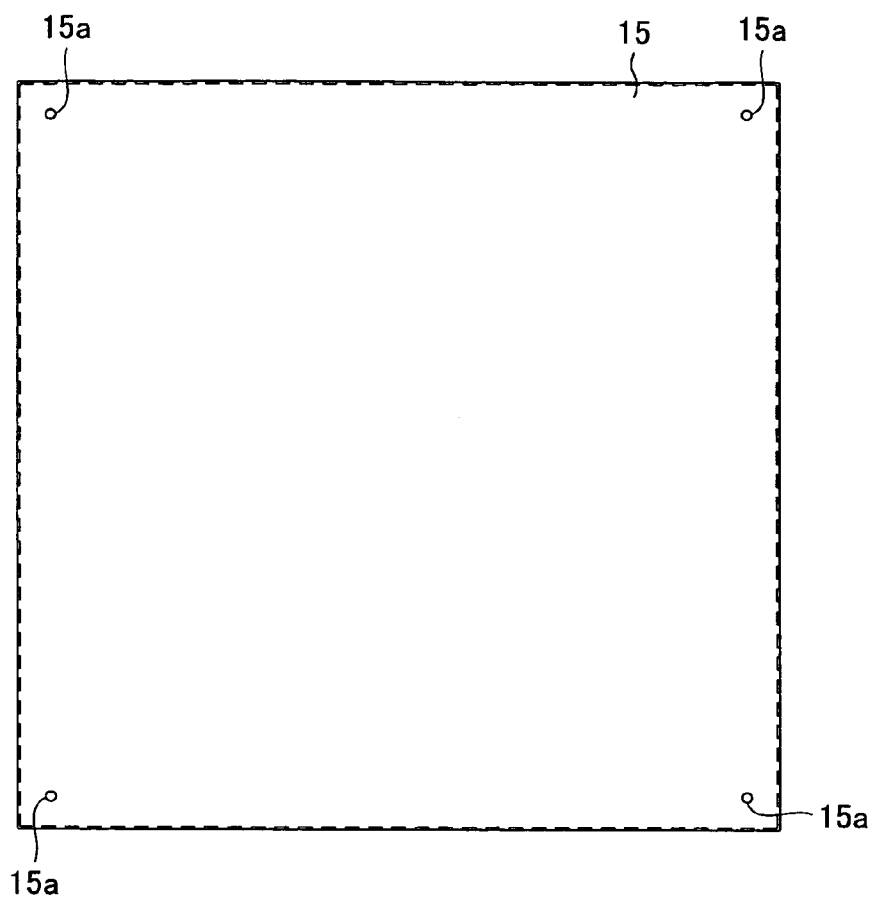
FIG. 5(a) is a plan view of a cover.
FIG. 5(b) is a side view of FIG. 5(a).
FIG. 5(c) is a side view of FIG. 5(a).
Figure 5:
Figure 5:

The measuring substrate 1 will be described in detail below with reference to FIGS. 2 and 5.

Figure 2:
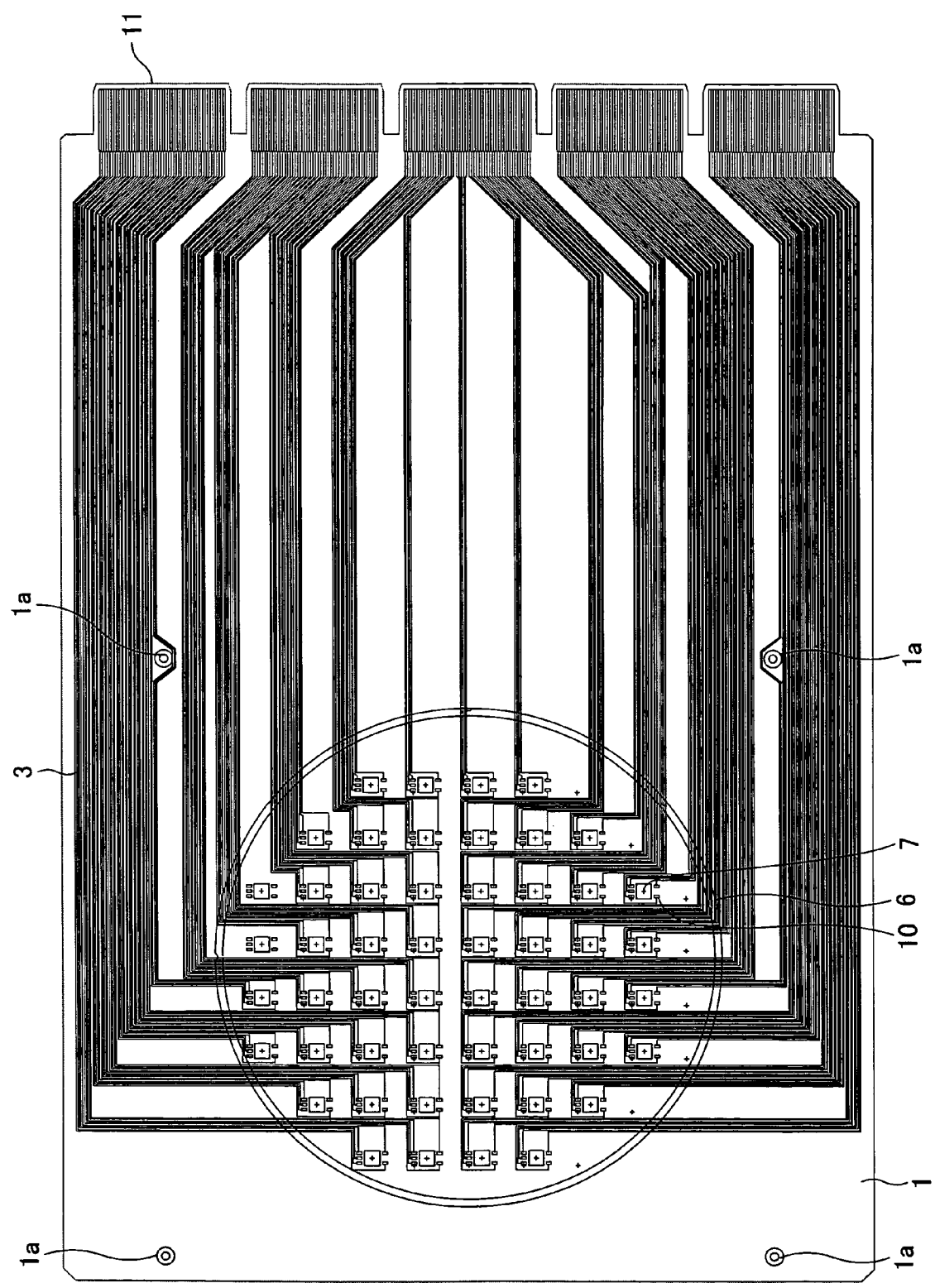
FIG. 2 is a schematic plan view of a measuring substrate for use in the semiconductor testing device shown in FIG. 1.
Figure 3:
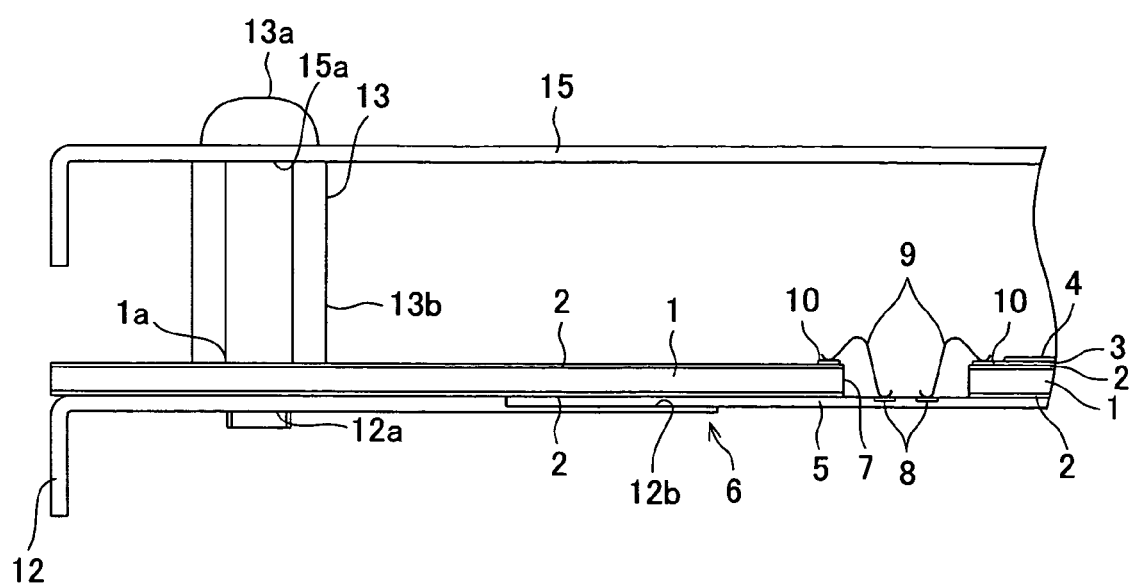
FIG. 3 is a schematic diagram showing a main portion of the measuring substrate, shown in FIG. 2, having a semiconductor wafer thereon.
Figure 4:
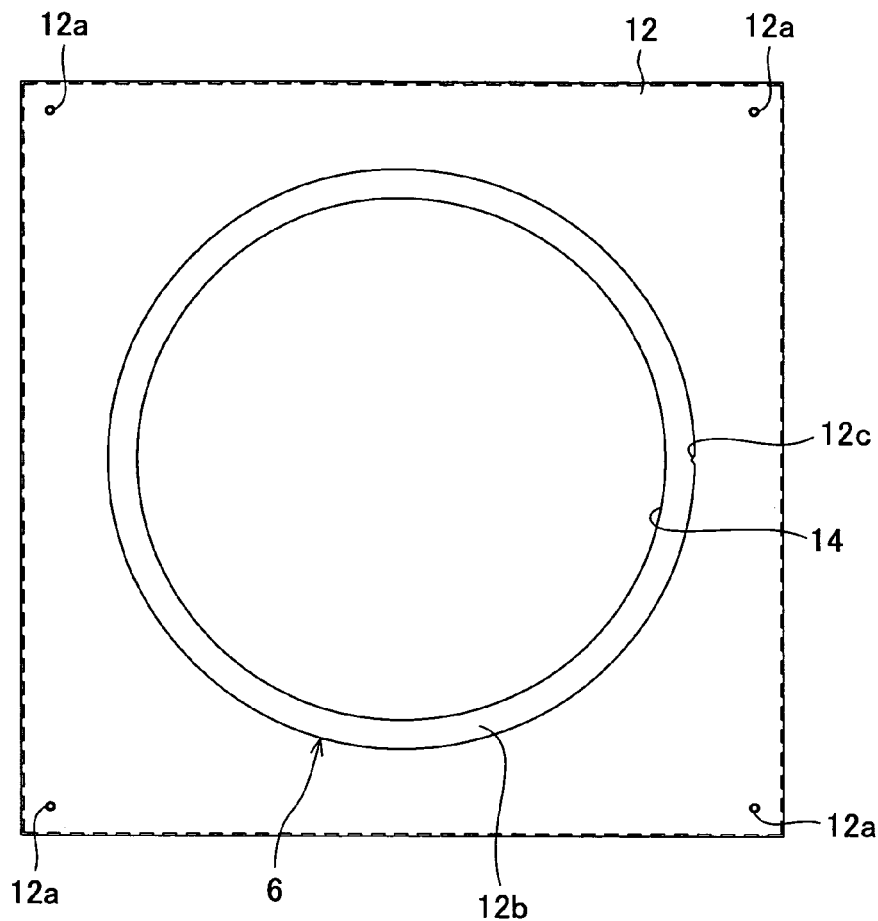
FIG. 4(a) is a plan view of a wafer holder.
FIG. 4(b) is a side view of FIG. 4(a).
FIG. 4(c) is a side view of FIG. 4(a).
Figure 4:
Figure 4:

FIG. 2 is a plan view of the measuring substrate 1, before the semiconductor wafer 5 is mounted on. FIG. 3 is an enlarged view schematically showing a state in which the semiconductor wafer 5 has been mounted on the measuring substrate 1. FIGS. 4(a) to 4(c) show a wafer holder 12 (wafer supporting member) that is used when the semiconductor wafer 5 is mounted on the measuring substrate 1. FIGS. 5(a) to 5(c) show a cover (protecting cover) 15 for covering the bonding side of the measuring substrate 1, with the semiconductor wafer 5 and the measuring substrate 1 being wire bonded.

As shown in FIG. 2, the measuring substrate 1 is realized by an oblong metal plate (stainless steel SUS 430). Both sides of the measuring substrate 1 have a vitreous electrical insulating layer 2 thereon (see FIG. 3), a wiring pattern 3 is formed on one of the electrical insulating layer 2, and an overcoats layer 4 (see FIG. 3) for protecting the wiring pattern 3 is formed thereon.

A mount part 6 for the semiconductor wafer 5 to be tested on the measuring substrate 1 has a multiplicity of holes (through holes) 7 for the bonding wires according to the die layout of the semiconductor wafer 5. That is, the holes 7 are provided to expose pads necessary for the evaluation test of each die of the semiconductor wafer 5.

Therefore, as shown in FIG. 3, the bonding pads 8 of the semiconductor wafer 5 are exposed inside of the wiring holes 7, and surrounding each wiring hole 7 are five substrate-side bonding pads 10 for making bonding interconnections with aluminum wires 9.

Four of the five substrate-side bonding pads 10 are four-wire measuring terminals for accurately measuring the electric resistance of the thin wiring of the evaluation element (not shown) formed on the semiconductor wafer 5. The remaining one is a terminal for measuring electric leakage inside the evaluation element. The wiring pattern 3 is delineated from each of the five terminals to the terminal 11 that is to be connected to a measuring instrument (not shown).

In addition, the measuring substrate 1 is provided with holes 1a at four corners around the mount part 6 of the semiconductor wafer 5. The holes 1a are to fix the wafer holder 12 and the cover 15, as will be described later.

The wafer holder 12 is, as shown in FIG. 3, an auxiliary member for mounting and anchoring the semiconductor wafer 5 in a predetermined place (mount part 6) of the measuring substrate 1, and is used by being bolted to the back of the measuring substrate 1 (the side without the wiring pattern 3) with a male-female stud bolt 13.

As shown in FIG. 4(a), the wafer holder 12, in the center thereof, has an aperture 14 slightly smaller in outer diameter than the semiconductor wafer 5. The wafer holder 12 also has a step 12b, concentric to the aperture 14, equal in diameter to the semiconductor wafer 5, and equivalent in depth to the thickness of the semiconductor wafer 5. The step 12b is formed by etching the surface of the wafer holder 12 in contact with the back of the measuring substrate 1.

In addition, at four corners around the aperture 14 in the wafer holder 12, holes 12a are provided in the same position as the holes 1a in the measuring substrate 1.

The semiconductor wafer 5 is anchored on the mount part 6 by bolting the male-female stud bolt 13 to the measuring substrate 1 through the holes 1a in the measuring substrate 1 and then through the hole 12a in the wafer holder 12, so that the back of the measuring substrate 1 and the surface of the semiconductor wafer 5 (the side with an evaluation element) are in contact with each other with the semiconductor wafer 5 housed in the step 12b of the wafer holder 12. Moreover, the wafer holder 12 is provided with a notch 12c for preventing the semiconductor wafer 5, when mounted, from rotating in the mount part 6. The notch 12c is to engage a cut-out portion (not shown) of the semiconductor wafer 5.

In addition, as shown in FIGS. 4(b) and 4(c), the four sides of the wafer holder 12 are bent for reinforcement.

Further, in order to anchor the semiconductor wafer 5 on a wire bonder in a later step of bonding wiring, the semiconductor wafer 5 is vacuum-chucked through the aperture 14.

Note that, although FIG. 4(a) in this embodiment shows that the wafer holder 12 has its profile center corresponding to the center of the aperture 14, one type of measuring substrate 1 can be used for plural types of semiconductor wafers having various die layouts by moving the position of the aperture 14 according to the die layout of the semiconductor wafer 5.

In addition, as shown in FIG. 3, the cover 15 is provided on the opposite side of the measuring substrate 1 from the semiconductor wafer 5.

As shown in FIG. 5(a), the cover 15 has holes 15a in four corners thereof. The cover 15 is placed over the surface of the measuring substrate 1 (the side with the wiring pattern 3) and fixed with the female screw 13a of the male-female stud bolt, so as to cover the entire area of the wafer mount part 6 of the measuring substrate 1. The cover 15 is used for protecting the bonding wires and preventing accumulation of dust and the like in handling the measuring substrate 1 finished with bonding wiring.

In addition, as is the case with the wafer holder 12, the cover 15 is also made of stainless steel and, as shown in FIGS. 5(b) and 5(c), has its four corners bent for reinforcement.

In the following, a semiconductor testing method using the semiconductor testing device of the above-mentioned structure will be described.

Specifically, the following will describe a semiconductor testing method that, with the semiconductor wafer 5 mounted as a test piece on the measuring substrate 1, conducts an evaluation test by applying an evaluation test signal on the semiconductor wafer 5 through the measuring substrate 1. An evaluation test can be conducted both suitably and inexpensively by carrying out the following steps.

It is to be noted that the measuring substrate 1 is set substantially horizontally in the high temperature chamber 101.

First, in the first step, the semiconductor wafer 5 is mounted, using the wafer holder 12, on the opposite side of the measuring substrate 1 from the wiring pattern 3. Here, the holes 12a of the wafer holder 12 and the holes 1a of the measuring substrate 1 are aligned respectively with each other, and are bolted together with the male screw 13b of the male-female stud bolt 13.

Next, in the second step, the bonding pads 10 of the wiring pattern 3 on the measuring substrate 1 and the bonding pads 8 of the semiconductor wafer 5 are wire bonded with aluminum wires 9.

Then, the cover 15 is placed over the surface of the measuring substrate 1 provided with the wiring pattern 3, where the aluminum wires 9 are exposed. Here, the holes 15a in the cover 15 and the male screws 13b of the male-female stud bolts 13 bolted in the holes 1a in the measuring substrate 1 are aligned with each other and then bolted together with the female screw 13a.

Thereafter, in the third step, as shown in FIG. 1, the measuring substrate 1 with the semiconductor wafer 5 thereon is set in the high temperature chamber 101 with the semiconductor wafer 5 side facing up. The terminal 11 of the measuring substrate 1 interdigitates the connector 19 to electrically connect the evaluation element of the semiconductor wafer 5 to a measuring instrument.

Finally, in the fourth step, a signal according to a semiconductor test is applied to the semiconductor wafer 5, and the high temperature chamber 101 is heated up to a test temperature (400° C. in this embodiment).

The measuring substrate 1 so prepared in the foregoing steps is placed and set in the high temperature chamber 101 upside down. That is, the measuring substrate 1 is set with the semiconductor wafer 5 side facing up.

The first purpose of placing the measuring substrate 1 in the high temperature chamber 101 upside down is to prevent adverse effects of dust on test results. For example, accurate test results cannot be obtained when carbonized dust (conductive) and the like generated by the heat of testing deposits and adheres to exposed parts of the measuring substrate 1 or the semiconductor wafer 5, such as the bonding pads and bonding wires.

The second purpose is to ensure that the semiconductor wafer 5 is tightly in contact with the measuring substrate 1 with its own weight, enabling accurate testing. This is important in consideration of deformation of the wafer holder 12 supporting the semiconductor wafer 5, caused for example by thermal expansion. For example, when heat is applied with the semiconductor wafer 5 side of the measuring substrate 1 facing down, the wafer holder 12 may be deformed and the semiconductor wafer 5 may move out of position on the measuring substrate 1. When the semiconductor wafer 5 moves out of position on the measuring substrate 1, the aluminum wires 9 may be broken, with the result that accurate testing cannot be carried out.

As described above, in the semiconductor testing device according to this embodiment, the terminal portion for applying an evaluation test signal is located outside of the high temperature chamber 101 and therefore will not be exposed to such a high temperature of 400° C., for example, even in an evaluation method such as EM evaluation in which a semiconductor wafer needs to be heated to about 400° C.

Furthermore, since the measuring substrate 1 is realized by a substantially oblong metal plate whose surface is coated with an insulating film capable of withstanding temperatures required for the evaluation test, it is no longer necessary to use a conventional expensive ceramic substrate. As a result, an inexpensive evaluation device, i.e., semiconductor testing device can be provided.

Provided on the opposite side of the measuring substrate 1 from the semiconductor wafer 5 is the protection cover 15 for protecting the wire bonded part. By the provision of the cover 15, the bonding wires will not be damaged and accumulation of dust and the like can be prevented in handling the measuring substrate 1 finished with bonding wiring.

In addition, in the high temperature chamber 101, the measuring substrate 1 is set substantially horizontally with the semiconductor wafer 5 side facing up and the wiring pattern side facing down. This allows the semiconductor wafer 5 to be tightly in contact with the measuring substrate 1 with its own weight.

When the semiconductor wafer 5 is facing down, moving the measuring substrate 1 with the semiconductor wafer 5 mounted thereon causes problems such as the breaking down of a bonding wire connecting the semiconductor wafer 5 to the measuring substrate 1. On the other hand, when the semiconductor wafer 5 is facing up, the semiconductor wafer 5 is tightly in contact with the measuring substrate 1 by its own weight, and as such there will be no stress on the bonding wire connecting to the wiring pattern. As a result, the breaking down of the bonding wire can be prevented. Thus, the test reliability of the semiconductor testing device can be improved.

Furthermore, with the semiconductor wafer 5 side of the measuring substrate 1 facing up, the wafer holder 12 serving as a wafer supporting member for supporting the semiconductor wafer 5 is on the semiconductor wafer 5. Thus, even if the wafer holder 12 is deformed by heat, the semiconductor wafer 5 thereunder will not be affected. As such, the semiconductor wafer 5 will not be moved out of position on the measuring substrate 1 even if the wafer holder 12 is deformed by heat. There accordingly will be no breakage of the bonding wires.

In addition, setting the measuring substrate 1 upside down in the high temperature chamber 101 can prevent adverse effects of dust on test results. For example, accurate test results cannot be obtained when carbonized dust (conductive) generated by the heat of testing deposits and adheres to the wiring pattern of the measuring substrate 1 or the bonding parts of the semiconductor wafer 5.

Furthermore, it is preferable that the measuring substrate 1 have exchamberent heat resistance and be able to be produced inexpensively. For example, a stainless steel plate may be used as a steel plate, and a glass coating film as an insulating film.

Although, in this embodiment, the wafer holder 12 is etched so that the semiconductor wafer 5 may be mounted thereon, etching may be carried out on the side of the measuring substrate 1 where the semiconductor wafer 5 is mounted.

Figure 6:
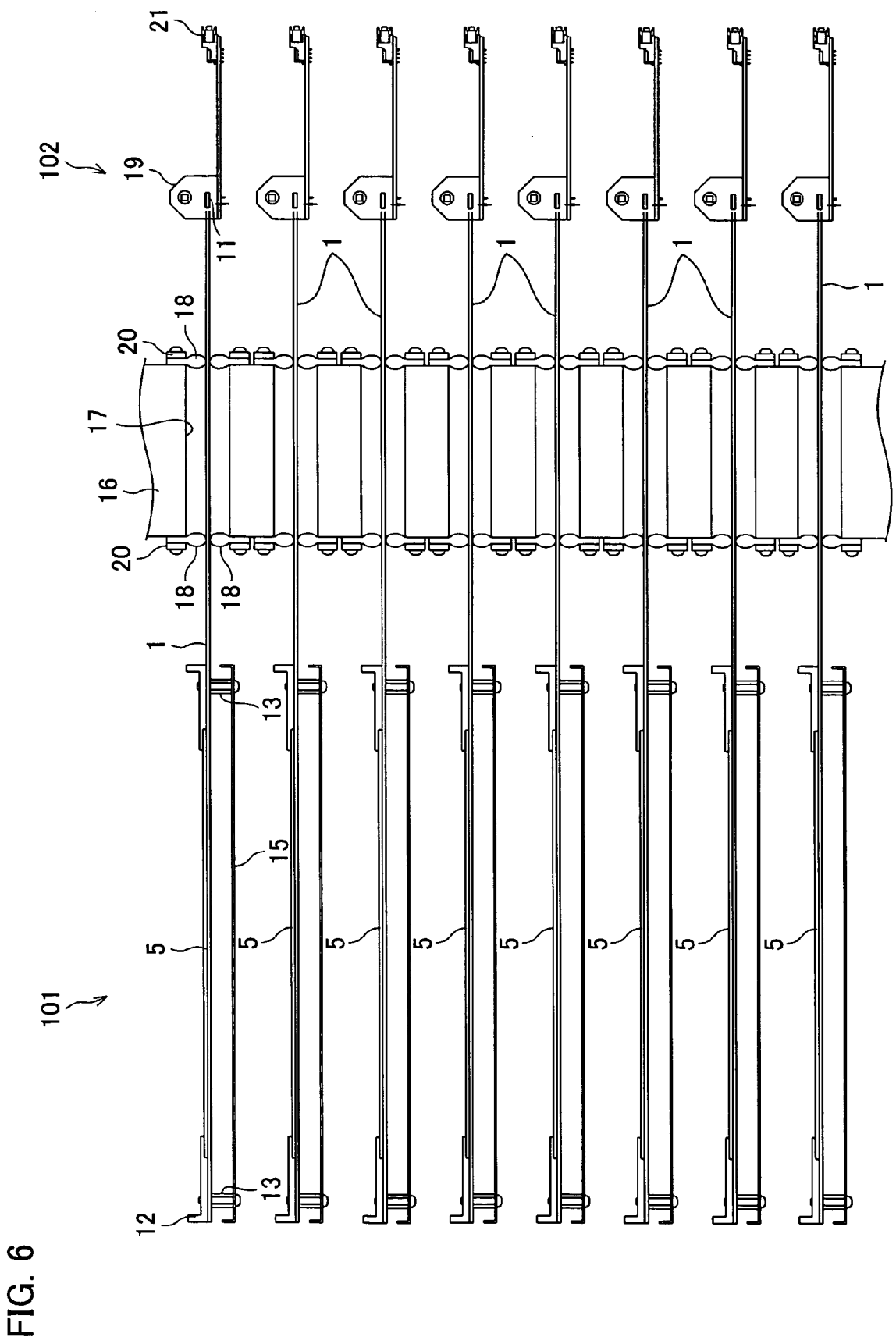
FIG. 6 is a schematic diagram showing a main portion of a semiconductor testing device with measuring substrates set in a multistage manner, according to another embodiment of the present invention.

Moreover, although this embodiment described the case in which one measuring substrate 1 with the semiconductor wafer 5 is set in the semiconductor device as illustrated in FIG. 1, the present invention is not limited by the described embodiment. For example, as shown in FIG. 6, a plurality of measuring substrates 1 may be set in a multistage manner in the high temperature chamber 101.

By thus setting a plurality of measuring substrates 1 in a multistage manner in the high temperature chamber 101, a large number of semiconductor wafers 5 can be tested simultaneously. In this case, by sending the same evaluation test signal to all the semiconductor wafers 5, identical evaluation tests can be conducted simultaneously on a large number of semiconductor wafers 5. Similarly, by sending different evaluation test signals to the semiconductor wafers 5, different evaluation tests can be conducted simultaneously on a large number of semiconductor wafers 5.

A semiconductor testing device of the present invention is suitable particularly for EM evaluation tests and the like required to be conducted under high temperatures. However, a semiconductor testing device is also applicable to other types of evaluation tests required to be conducted under high temperatures, and evaluation tests not particularly required to be conducted under high temperatures. In addition, the invention is also applicable to TDDB (Time Dependence Dielectric Breakdown) evaluation tests, in which high voltage is applied to the insulating film (oxidized film) of a semiconductor to test various properties of the insulating film of the semiconductor, such as insulation, dielectric breakdown voltage, and time dependence.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor testing device for, with a semiconductor wafer mounted as a test piece on a measuring substrate, conducting an evaluation test on the semiconductor wafer by applying an evaluation test signal to the semiconductor wafer through the measuring substrate, the semiconductor testing device comprising:

a high temperature chamber for setting a temperature of the semiconductor wafer mounted on the measuring substrate at a temperature required for an evaluation test; and a wafer supporting member for supporting the semiconductor wafer when the semiconductor wafer is mounted on the measuring substrate, the measuring substrate being a substantially oblong steel plate whose surface is coated with an insulating film capable of withstanding high temperatures required for evaluation tests, the measuring substrate being provided with holes therethrough for exposing a pad of each of the dies of the semiconductor wafer mounted on the measuring substrate, the semiconductor wafer being supported by said wafer supporting member on one side of the measuring substrate, and the other side of the measuring substrate being provided with a wiring pattern for transmitting the evaluation test signal to the semiconductor wafer supported on the measuring substrate, the measuring substrate being set for the evaluation test so that, with the pad of each of the dies and the wiring pattern being wire bonded through the holes, a mount part of the semiconductor wafer and a terminal part for applying the evaluation test signal are placed respectively inside and outside of said high temperature chamber.

2. A semiconductor testing device according to claim 1, wherein the measuring substrate, on the opposite surface from the semiconductor wafer, is provided with a protection cover for protecting wire bonding parts.

3. A semiconductor testing device according to claim 1, wherein said measuring substrate is set substantially horizontally in said high temperature chamber, with the semiconductor wafer side facing up and the wiring pattern side facing down.

4. A semiconductor testing device according to claim 1, wherein a plurality of the measuring substrates are set in a multistage manner in said high temperature chamber.

5. A semiconductor testing method for, with a semiconductor wafer mounted as a test piece on a measuring substrate, conducting an evaluation test on the semiconductor wafer by applying an evaluation test signal to the semiconductor wafer through the measuring substrate, the semiconductor testing method comprising the steps of:

(i) mounting the semiconductor wafer, with a wafer supporting member, in a predetermined place on one side of the measuring substrate, the measuring substrate being a substantially oblong steel plate whose surface is coated with an insulating film capable of withstanding temperatures required for the evaluation test, the measuring substrate in a mount part of the semiconductor wafer having holes therethrough for exposing a pad of each of the dies of the semiconductor wafer, the other side of the measuring substrate having a wiring pattern thereon for transmitting the evaluation test signal to the semiconductor wafer;

(ii) wire bonding each of the dies of the semiconductor wafer and the wiring pattern through the holes;

(iii) setting the measuring substrate finished with wire bonding in said step (ii) so that the semiconductor wafer mounted on the measuring substrate is placed inside of a high temperature chamber for setting a temperature required for the evaluation test of the semiconductor wafer, and that a part of a wiring pattern that applies the evaluation test signal is placed outside of the high temperature chamber; and (iv) applying the evaluation test signal to the wiring pattern of the measuring substrate set in the high temperature chamber.

6. A semiconductor testing method according to claim 5, wherein a protection cover for protecting a wire bonding part is provided on the opposite side of the measuring substrate from the semiconductor wafer, the protection cover being provided after said step (ii) and before said step (iii).

7. A semiconductor testing method according to claim 5, wherein, in said step (iii), the measuring substrate is set substantially horizontally in the high temperature chamber, with the semiconductor wafer side facing up and the wiring pattern side facing down.

8. A semiconductor testing device according to claim 5, wherein, in said step (iii), a plurality of the measuring substrates finished with wire bonding are set in a multistage manner in the high temperature chamber.

* * * * *